US008335663B2

(12) United States Patent
Nee et al.

(10) Patent No.: US 8,335,663 B2
(45) Date of Patent: Dec. 18, 2012

(54) SIGNAL ACQUISITION SYSTEM AND METHOD

(75) Inventors: Chi-Ping Nee, Santee, CA (US); Shachar Kons, Haifa (IL); Uri Parker, Shimshit (IL); Yoni Baron, Haifa (IL)

(73) Assignee: Conexant Systems, Inc., Newport Beach, CA (US)

( * ) Notice: Subject to any disclaimer, the term of this patent is extended or adjusted under 35 U.S.C. 154(b) by 626 days.

(21) Appl. No.: 12/126,345

(22) Filed: May 23, 2008

(65) Prior Publication Data

US 2009/0292507 A1 Nov. 26, 2009

(51) Int. Cl.
*H03F 1/26* (2006.01)

(52) U.S. Cl. ........................................................ 702/189

(58) Field of Classification Search .................. 702/189; 341/68; 348/21

See application file for complete search history.

(56) References Cited

U.S. PATENT DOCUMENTS

| | | | | |
|---|---|---|---|---|
| 6,697,098 | B1 * | 2/2004 | Wang | 348/21 |
| 2003/0193423 | A1 * | 10/2003 | Ng et al. | 341/68 |
| 2006/0023811 | A1 * | 2/2006 | Yoon | 375/326 |
| 2009/0217334 | A1 * | 8/2009 | Nee | 725/111 |

* cited by examiner

*Primary Examiner* — Jonathan C Teixeira Moffat
*Assistant Examiner* — Xiuquin Sun
(74) *Attorney, Agent, or Firm* — Jackson Walker L.L.P.; Christopher J. Rourk

(57) ABSTRACT

A system for signal processing is provided. The system includes a steady state processing system for receiving a signal. A general purpose processing system is coupled to the steady state processing system and includes a signal acquisition system for receiving the signal and generating acquisition data. The steady state processing system can receive the acquisition data from the signal acquisition system and use the acquisition data to acquire the signal.

19 Claims, 2 Drawing Sheets

SIGNAL ACQUISITION SYSTEM AND METHOD

FIELD OF THE INVENTION

The invention relates to signal processing, and more specifically to a signal acquisition system and method that utilize a general purpose processor or other suitable processors for signal acquisition and a dedicated circuit for steady state signal processing and error decoding.

BACKGROUND OF THE INVENTION

Dedicated demodulator systems and circuits that receive and process signals must include signal acquisition circuitry as well as circuitry for steady state processing of the signal. Because the systems required to perform signal acquisition are more complex than the systems required for steady state processing, those systems significantly increase both the size and cost of demodulator systems and circuits.

SUMMARY OF THE INVENTION

The current invention provides a signal acquisition system and method that utilizes the processor of an associated general purpose processing platform or other suitable processors to perform signal acquisition, so as to reduce the systems and circuitry required for a demodulator.

In accordance with an exemplary embodiment of the present invention, a system for signal processing is provided. The system includes a steady state processing system for receiving a signal. A general purpose processing system is coupled to the steady state processing system and includes a signal acquisition system for receiving the signal and generating acquisition data. The steady state processing system can receive the acquisition data from the signal acquisition system and use the acquisition data to acquire the signal.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
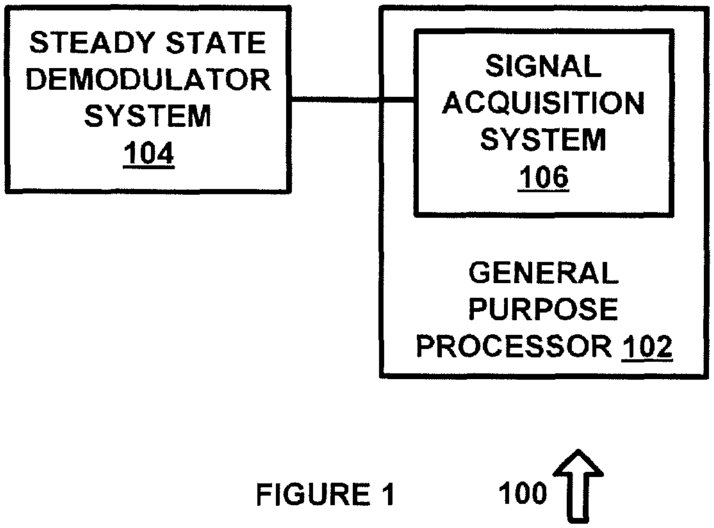
FIG. 1 is a diagram of a system for signal acquisition in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a system 100 for signal acquisition in accordance with an exemplary embodiment of the present invention. System 100 utilizes a general purpose processor or other suitable processors for signal acquisition, so as to utilize a dedicated steady-state demodulator that is less complex and which can be manufactured at lower cost than existing demodulators.

System 100 includes general purpose processor 102 and signal acquisition system 106, which can be implemented in hardware, software or a suitable combination of hardware and software, and which can be one or more software systems operating on general purpose processor 102. As used herein, "hardware" can include a combination of discrete components, an integrated circuit, an application-specific integrated circuit, a field programmable gate array, a digital signal processor, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

Signal acquisition system 106 is coupled to steady state demodulator system 104. As used herein, the term "coupled" and its cognate terms such as "couples" or "couple," can include a physical connection (such as a wire, optical fiber, or a telecommunications medium), a virtual connection (such as through randomly assigned memory locations of a data memory device or a hypertext transfer protocol (HTTP) link), a logical connection (such as through one or more semiconductor devices in an integrated circuit), other suitable connections, or a suitable combination of connections.

Steady state demodulator system 104 receives a transmitted signal and demodulates the transmitted signal. In one exemplary embodiment, steady state demodulator system 104 can operate in two modes of operation. In the first mode of operation, steady state demodulator system 104 can receive the transmitted signal and can provide the transmitted signal to signal acquisition system 106, which determines the frequency offset, sampling clock offset, time offset, phase offset and other signal characteristics. Signal acquisition system 106 then transmits control data to steady state demodulator system 104 to allow the transmitted signal to be demodulated, to allow steady state demodulator system 104 to perform error correction decoding, and for other suitable purposes. The transmitted signal can then be monitored by steady state demodulator system 104, signal acquisition system 106 or other suitable systems, and if additional acquisition processing is required due to momentary signal loss or other reasons, signal acquisition system 106 can perform additional signal acquisition processing.

In operation, steady state demodulator system 104 can be optimized for steady state signal processing, and can interface with signal acquisition system 106 operating on general purpose processor 102 to allow processor intensive signal acquisition processing to be performed by signal acquisition system 106. In this manner, steady state demodulator system 104 can be made with fewer components and at a lower cost than prior art demodulators, which include signal acquisition systems and circuitry. Likewise, steady state demodulator system 104 and signal acquisition system 106 can be used with special purpose processors, digital signal processors or other suitable processors.

Figure 2:
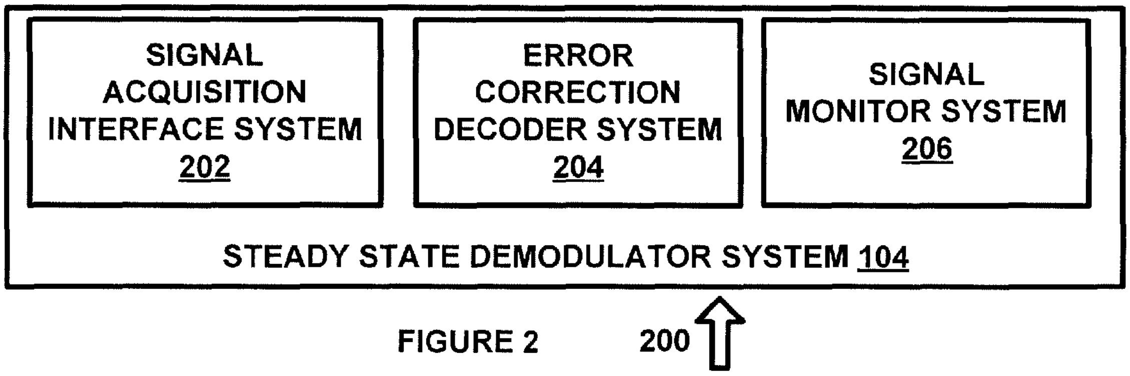
FIG. 2 is a diagram of system for steady state demodulator processing in accordance with an exemplary embodiment of the present invention.

FIG. 2 is a diagram of system 200 for steady state demodulator processing in accordance with an exemplary embodiment of the present invention. System 200 includes steady state demodulator system 104 and signal acquisition interface system 202, error correction decoder system 204 and signal monitor system 206, each of which can be implemented in hardware, software or a suitable combination of hardware and software, and which can be one or more hardware systems in an application specific integrated circuit.

Signal acquisition interface system 202 transmits signal data to a signal acquisition system and receives data from the signal acquisition system, such as mode control data, frequency offset data, sampling clock offset data, time offset data, phase offset data and other suitable data. In one exemplary embodiment, signal acquisition interface system 202 receives a transmitted signal and provides the transmitted signal to the signal acquisition system in a first mode of operation, such as where signal acquisition interface system 202 does not perform error correction decoding. Signal acquisition interface system 202 can also receive data from the signal acquisition system and can adjust a frequency offset, sampling clock offset, time offset, phase offset or other suitable parameters of a demodulator so as to allow the transmitted signal to be received and processed.

Error correction decoder system 204 receives transmitted signal data and performs error correction decoder processing on the transmitted signal. In one exemplary embodiment, error correction decoder system 204 can operate in two modes of operation, such as where error correction decoding is disabled until signal acquisition, and where error correction decoding is performed after signal acquisition has occurred.

Signal monitor system 206 monitors the transmitted signal and generates signal acquisition data, such as where it is determined that acquisition of the transmitted signal has been lost. In one exemplary embodiment, a sync byte can be detected, and upon loss of sync byte signal monitor system 206 can generate the signal acquisition data. In addition, mode change data can be generated to cause system 200 to change between a steady state processing mode and a signal acquisition mode.

In operation, system 200 allows steady state processing of a transmitted signal to be performed by an application specific integrated circuit or other dedicated systems, while signal acquisition is performed by a general purpose processor or other suitable processors having greater processing capability. In this manner, the size and cost of a demodulator or other peripheral component that utilizes system 200 can be decreased.

Figure 3:
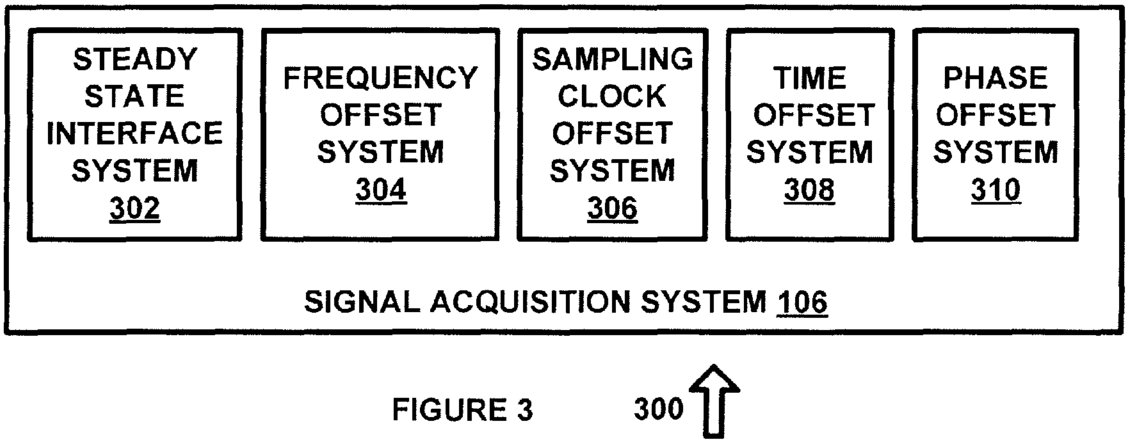
FIG. 3 is a diagram of a system for signal acquisition in accordance with an exemplary embodiment of the present invention.

FIG. 3 is a diagram of a system 300 for signal acquisition in accordance with an exemplary embodiment of the present invention. System 300 includes signal acquisition system 106 and steady state interface system 302, frequency offset system 304, sampling clock offset system 306, time offset system 308 and phase offset system 310, each of which can be implemented in hardware, software or a suitable combination of hardware and software, and which can be one or more software systems operating on a general purpose processing system.

Steady state interface system 302 receives a transmitted signal from a steady state demodulator and initiates signal acquisition processing for the transmitted signal. In one exemplary embodiment, steady state interface system 302 can receive an acquisition request from a demodulator or other suitable systems and can initiate processing of the transmitted signal by other systems of system 300, and can transmit signal acquisition parameters to the demodulator or other requesting system when they are established. In another exemplary embodiment, steady state interface system 302 can receive a reacquisition request from the demodulator or other external system, such as where acquisition of the transmitted signal has been lost and the transmitted signal must be reacquired. Other suitable processes can also or alternatively be performed by steady state interface system 302.

Frequency offset system 304 processes the transmitted signal and generates frequency offset data. In one exemplary embodiment, a demodulator can receive the frequency offset data generated by frequency offset system 304 and can correct a frequency offset of a signal processor in order to allow the transmitted signal to be demodulated so that data encoded into the transmitted signal can be detected. Frequency offset system 304 can be instantiated upon receipt of control data from steady state interface system 302 or in other suitable manners, so as to minimize the load on a general purpose processor that operates frequency offset system 304, or other suitable processes can be used to allow frequency offset system 304 to be operated on demand when needed and to remain in a standby state, an idle state or to otherwise require minimum processing resources when not needed.

Sampling clock offset system 306 processes the transmitted signal and generates sampling clock offset data. In one exemplary embodiment, a demodulator can receive the sampling clock offset data generated by sampling clock offset system 306 and can correct a sampling clock offset of a signal processor in order to allow the transmitted signal to be demodulated so that data encoded into the transmitted signal can be detected. Sampling clock offset system 306 can be instantiated upon receipt of control data from steady state interface system 302 or in other suitable manners, so as to minimize the load on a general purpose processor that operates sampling clock offset system 306, or other suitable processes can be used to allow sampling clock offset system 306 to be operated on demand when needed and to remain in a standby state, an idle state or to otherwise require minimum processing resources when not needed.

Time offset system 308 processes the transmitted signal and generates time offset data. In one exemplary embodiment, a demodulator can receive the time offset data generated by time offset system 308 and can correct a timing offset of a signal processor in order to allow the transmitted signal to be demodulated so that data encoded into the transmitted signal can be detected. Time offset system 308 can be instantiated upon receipt of control data from steady state interface system 302 or in other suitable manners, so as to minimize the load on a general purpose processor that operates time offset system 308, or other suitable processes can be used to allow time offset system 308 to be operated on demand when needed and to remain in a standby state, an idle state or to otherwise require minimum processing resources when not needed.

Phase offset system 310 processes the transmitted signal and generates phase offset data. In one exemplary embodiment, a demodulator can receive the phase offset data generated by phase offset system 310 and can correct a phase offset of a signal processor in order to allow the transmitted signal to be demodulated so that data encoded into the transmitted signal can be detected. Phase offset system 310 can be instantiated upon receipt of control data from steady state interface system 302 or in other suitable manners, so as to minimize the load on a general purpose processor that operates phase offset system 310, or other suitable processes can be used to allow phase offset system 310 to be operated on demand when needed and to remain in a standby state, an idle state or to otherwise require minimum processing resources when not needed.

In operation, system 300 performs signal acquisition processing to provide a steady state demodulator or other suitable systems with frequency offset data, sampling clock offset data, timing offset data, phase offset data or other suitable data that is used by the demodulator to perform steady state signal processing of a transmitted signal. System 300 can utilize the processing resources of a general purpose processor, a digital signal processor or other suitable processors, so as to allow a peripheral device or other dedicated device to be used for steady state signal processing.

Figure 4:
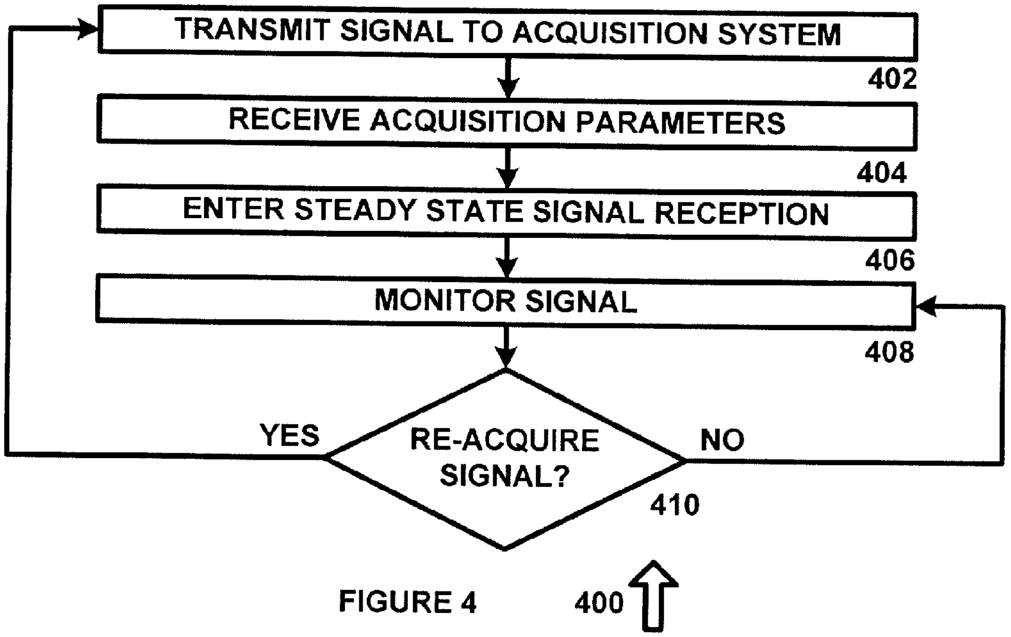
FIG. 4 is a flow chart of a method for processing a transmitted signal in accordance with an exemplary embodiment of the present invention.

FIG. 4 is a flow chart of a method 400 for processing a transmitted signal in accordance with an exemplary embodiment of the present invention. Method 400 can be implemented in software or hardware, and can be performed by one or more discrete components in a steady state demodulator or other suitable systems.

Method 400 begins at 402 where a transmitted signal is provided to a signal acquisition system. In one exemplary embodiment, the transmitted signal can be received at a demodulator or other suitable systems, and can be provided to the signal acquisition system with request data that causes the signal acquisition system to perform acquisition processing on the transmitted data. In another exemplary embodiment, the demodulator or other system can perform predetermined processes on the transmitted signal, such as to detect a sync byte or other suitable data, and acquisition processing can be requested if the sync byte or other data is not detected. Other suitable processes can also or alternatively be used. The method then proceeds to 404.

At 404, acquisition parameters are received from the signal acquisition system. In one exemplary embodiment, a predetermined data channel, data format, or other suitable processes can be used to receive frequency offset data, sampling clock offset data, timing offset data, phase offset data or other suitable data that is used for steady state processing of a transmitted signal. The method then proceeds to 406.

At 406, steady state signal reception is performed, such as by utilizing the acquisition parameters to control settings on a demodulator to allow encoded data to be extracted from a transmitted signal. In one exemplary embodiment, additional processing such as error correction decoding or other suitable processing can also or alternatively be performed. The method then proceeds to 408, where the transmitted signal is monitored to determine whether acquisition has been lost, such as due to loss of signal, signal quality, or other factors. The method then proceeds to 410.

At 410, it is determined whether reacquisition of the signal is required. If reacquisition is not required, the method returns to 408 where monitoring of the signal continues. If reacquisition is required, the method returns to 402.

In operation, method 400 allows a peripheral device, a dedicated system or other suitable systems to perform steady state processing of a transmitted signal, and to interface with a signal acquisition system to allow the processor-intensive signal acquisition processing of the signal to be performed by a processor with greater processing capacity, such as a general purpose processor, a digital signal processor or other suitable processors. In this manner, the steady state signal processing system does not require additional components or processors that would otherwise be needed to perform signal acquisition processing, and can be smaller and less expensive.

Figure 5:
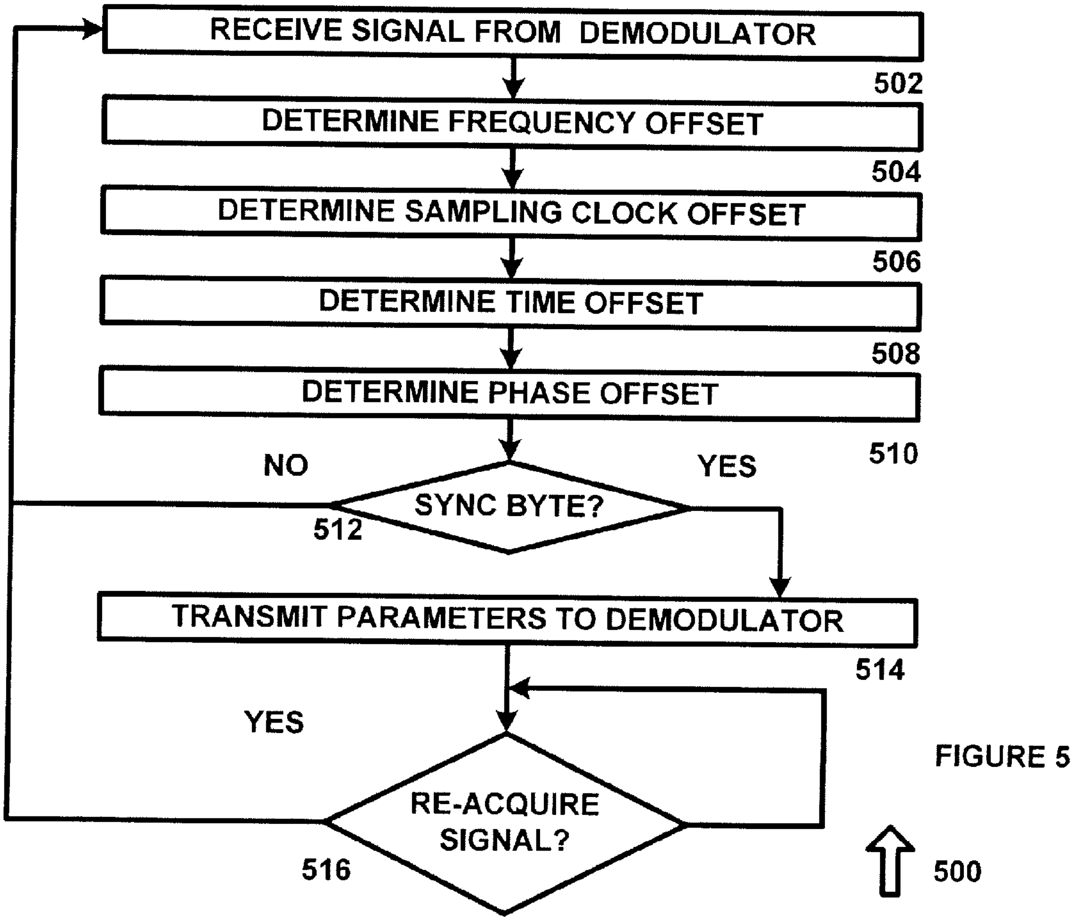
FIG. 5 is a flow chart of a method for performing acquisition processing in accordance with an exemplary embodiment of the present invention.

FIG. 5 is a flow chart of a method 500 for performing acquisition processing in accordance with an exemplary embodiment of the present invention. Method 500 can be implemented in software or hardware, and can be performed by one or more software systems operating on a general purpose processing platform or other suitable processors.

Method 500 begins at 502, where a transmitted signal is received from a demodulator or other suitable systems. In one exemplary embodiment, the transmitted signal can be sent with control data that indicates that the transmitted signal needs to be acquired in order for encoded data in the transmitted signal to be extracted from the transmitted signal or other control data. The method then proceeds to 504.

At 504, frequency offset data for the transmitted signal is determined. In one exemplary embodiment, signal acquisition processing of the transmitted signal can be performed by a suitable signal acquisition system, such as one or more signal processing software applications that are used to determine a frequency offset, a sampling clock offset, a timing offset, a phase offset, or other suitable parameters of a transmitted signal. These signal processing software applications can be loaded into a processor on demand, can be activated from a standby mode as needed, or can otherwise be operated when needed so as to reduce the processor load from operation of the signal processing software applications, by operating those applications only when signal acquisition is required. The signal acquisition processing can generate processing parameters for steady state processing in parallel, serially, using feedback processing or in other suitable manners. Thus, it is understood that determining the frequency offset determination at 504 may be performed first as shown, in a random order, or in other suitable manners. The method then proceeds to 506.

At 506, a sampling clock offset of the transmitted signal is determined. As previously described, the sampling clock offset can be determined as part of the signal acquisition process, can be determined second in order as shown, can be determined in random order relative to other processing parameters for steady state processing, or can be determined in other suitable manners. The method then proceeds to 508.

At 508, a time offset of the transmitted signal is determined. As previously described, the time offset can be determined as part of the signal acquisition process, can be determined third in order as shown, can be determined in random order relative to other processing parameters for steady state processing, or can be determined in other suitable manners. The method then proceeds to 510.

At 510, a phase offset of the transmitted signal is determined. As previously described, the phase offset can be determined as part of the signal acquisition process, can be determined second in order as shown, can be determined in random order relative to other processing parameters for steady state processing, or can be determined in other suitable manners. The method then proceeds to 512.

At 512, it is determined whether a sync byte or other suitable data can be detected. If a sync byte can not be detected, the method returns to 502. As previously discussed, detection of the sync byte may be performed as part of the overall signal acquisition processing, such that signal acquisition processing is terminated upon detection of the sync byte and return to 502 is not actually performed as a step. Likewise, detection of the sync byte can be performed after signal acquisition processing (such as to confirm signal acquisition) or in other suitable manners. If it is determined that the sync byte has been detected, the method proceeds to 514.

At 514, the signal processing parameters, such as the frequency offset, sampling clock offset, time offset, phase offset, or other suitable parameters, are transmitted to the demodulator or other steady state processor that receives the transmitted signal and extracts encoded data from the transmitted signal. The method then proceeds to 516.

At 516, it is determined whether reacquisition of the transmitted signal is required. In one exemplary embodiment, the demodulator or other steady state signal processor can transmit data indicating that loss of acquisition has occurred or may have occurred. Likewise, the signal acquisition system or other suitable systems can also or alternatively generate a control indicating that loss of acquisition has occurred or may have occurred, such as if a sync byte or other suitable data is not detected in the demodulated signal. If it is determined that reacquisition is not required, the method returns to 516 or otherwise continues until reacquisition is needed. Otherwise, the method returns to 502 or other suitable steps.

In operation, method 500 allows a demodulator or other suitable systems to perform steady state signal processing of a transmitted signal to extract encoded data from the transmitted signal, and allows signal acquisition processing to be performed by signal processing software or other systems operating on a general purpose processor or other suitable processors that have greater processing capacity. In this manner, signal acquisition, which only needs to be performed infrequently, can be performed using software or other functionality of the general purpose processor, while steady state processing can be performed using a dedicated steady state processor in a demodulator or other suitable systems.

Although exemplary embodiments of a method and apparatus of the present invention have been described in detail herein, those skilled in the art will also recognize that various substitutions and modifications can be made to the method and apparatus without departing from the scope and spirit of the appended claims.

What is claimed is:

1. A system for signal processing comprising:

a steady state demodulator system for receiving a modulated signal and demodulating the modulated signal if the modulated signal has been acquired, and outputting the modulated signal if the modulated signal has not been acquired; and a general purpose processing system coupled to the steady state demodulator system, the general purpose processing system comprising: a signal acquisition system for receiving the modulated signal and generating acquisition data;

wherein the steady state processing system can receive the acquisition data from the signal acquisition system and use the acquisition data to acquire the signal; and wherein the signal acquisition system comprises a phase offset system for determining a phase offset and generating phase correction data, wherein the phase offset system is inactive, in an idle state and consuming no power prior to receipt of control data from a steady state interface system and provides the phase correction data for provision to the steady state demodulator system.

2. The system of claim 1 wherein the signal acquisition system comprises a frequency offset estimate system for determining an estimate of a frequency offset of the signal and generating frequency offset correction data, wherein the frequency offset estimate system is inactive prior to receipt of control data from a steady state interface system.

3. The system of claim 1 wherein the signal acquisition system comprises a sampling clock offset system for determining an offset of a sampling clock and generating sampling clock correction data, wherein the sampling clock offset system is inactive and consuming no power prior to receipt of control data from a steady state interface system.

4. The system of claim 1 wherein the signal acquisition system comprises a timing offset system for determining a timing offset and generating timing correction data for provision to the steady state demodulator system.

5. The system of claim 1 wherein the steady state demodulator system further comprises an acquisition state system for generating an acquisition request if the modulated signal is being received and has not been acquired and receiving the acquisition data in response to the acquisition request.

6. The system of claim 1 wherein the steady state demodulator system further comprises a steady state monitor system for monitoring steady state signal parameters of the demodulated signal and generating an acquisition request if the steady state signal parameters of the demodulated signal exceed one or more predetermined values.

7. A method for signal processing comprising:

receiving a modulated signal at a receiver of a peripheral system of a general purpose processor;

providing the modulated signal from the peripheral system to the general purpose processor, wherein the general purpose processor instantiates one or more software systems to generate signal acquisition data;

receiving the signal acquisition data from the general purpose processor at the peripheral system;

applying the signal acquisition data to the receiver at the peripheral system to allow the receiver to demodulate the modulated signal; and wherein the receiver at the peripheral system comprises a phase offset system for determining a phase offset and generating phase correction data, wherein the phase offset system is inactive, in an idle state and consuming no power prior to receipt of control data from a steady state interface system and provides the phase correction data to the receiver for demodulating the modulated signal.

8. The method of claim 7 wherein receiving signal acquisition data comprises receiving frequency offset correction data and using the frequency offset correction data to control a demodulator.

9. The method of claim 7 wherein receiving signal acquisition data comprises receiving sampling clock offset correction data at the peripheral system.

10. The method of claim 7 wherein receiving signal acquisition data comprises receiving timing correction data at the peripheral system and using the timing correction to control a demodulator of the peripheral system.

11. The method of claim 7 wherein receiving signal acquisition data comprises receiving phase correction data.

12. The method of claim 7 further comprising switching from an acquisition mode of operation to a steady state mode of operation at the peripheral system after applying the signal acquisition data to the receiver.

13. The method of claim 7 further comprising:

monitoring the signal during the steady state mode of operation; and switching from the steady state mode of operation to the acquisition mode of operation if one or more steady state parameters exceed a predetermined level.

14. A system for signal processing comprising:

a steady state processing system having a demodulator, the steady state processing system in a peripheral device, the steady state processing system for receiving a modulated signal;

a general purpose processor remote from the peripheral device, the general purpose processor further comprising a signal acquisition system for receiving the modulated signal and generating acquisition data;

wherein the steady state processing system receives the acquisition data from the signal acquisition system and uses the acquisition data to demodulate the modulated signal, wherein the signal acquisition system switches to inactive status when the steady state processing system is demodulating the modulated signal; and wherein the signal acquisition system comprises a phase offset system for determining a phase offset and generating phase correction data, wherein the phase offset system is inactive, in an idle state and consuming no power prior to receipt of control data from a steady state interface system and provides the phase correction data for provision to the demodulator of the steady state processing system.

15. The system of claim 14 further comprising means for determining an estimate of a frequency offset of the modulated signal and generating frequency offset correction data.

16. The system of claim 14 further comprising means for determining an offset of a sampling clock and generating sampling clock correction data.

17. The system of claim 14 further comprising means for determining a timing offset and generating timing correction data.

18. The system of claim 14 further comprising means for determining a phase offset and generating phase correction data.

19. The system of claim 14 further comprising means for generating an acquisition request and receiving the acquisition data in response to the acquisition request.

* * * * *